United States Patent

[11] 3,568,093

[72] Inventors Fujio Ishida
Kokubunji-shi;
Yoshiaki Kato, Higashimurayama-shi,
Japan

[21] Appl. No. 786,153
[22] Filed Dec. 23, 1968
[45] Patented Mar. 2, 1971
[73] Assignee Citizen Watch Co., Ltd.
Tokyo, Japan
[32] Priority Jan. 31, 1968
[33] Japan
[31] 43/5921

[54] TEMPERATURE COMPENSATED OSCILLATOR USING TEMPERATURE CONTROLLED CONTINUAL SWITCHING OF FREQUENCY DETERMINING IMPEDANCE
6 Claims, 36 Drawing Figs.

[52] U.S. Cl. .......... 331/116, 331/157, 331/158, 331/176, 58/23
[51] Int. Cl. .......... H03b 3/04, H03b 5/36
[50] Field of Search .......... 331/176, 179, 116, 116 (M), 156, 158; 58/23 (A), 28 (A)

[56] References Cited

UNITED STATES PATENTS

| | | | |
|---|---|---|---|
| 3,270,296 | 8/1966 | Aizawa et al. | 331/116 |
| 3,373,379 | 3/1968 | Black | 331/116 |
| 3,386,051 | 5/1968 | Widl | 331/179X |
| 3,404,298 | 10/1968 | Roberts | 331/176X |

*Primary Examiner*—Roy Lake
*Assistant Examiner*—Siegfried H. Grimm
*Attorney*—Hall, Pollock and Vande Sande

ABSTRACT: Method of and device for compensating the temperature variation in the oscillation frequency of an oscillator wherein an impedance element, for example, a capacitor coupled to the oscillator is switched between two levels of its value, whereby the temperature variation is compensated for on an average.

Fujio Ishida
Yoshiaki Kato
INVENTOR

BY Hall, Pollock & Vande Sande
ATTORNEY

Fujio Ishida
Yoshiaki Kato
INVENTOR

BY Hall, Pollock & Vande Sande
ATTORNEY

Fujio Ishida
Yoshiaki Kato
INVENTOR

BY Hall, Pollock & Vande Sande
ATTORNEY

Fujio Ishida
Yoshiaki Kato
INVENTOR

BY Hall, Pollock & Vande Sande

ATTORNEY

Fujio Ishida
Yoshiaki Kato
INVENTOR

BY Hall, Pollock & Vande Sande
ATTORNEY

FIG. 14
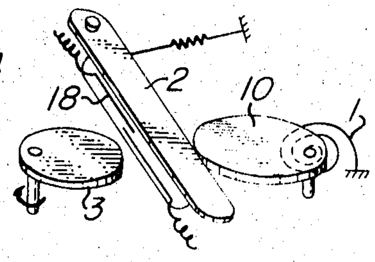
FIG. 15
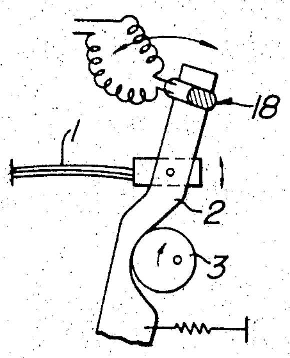
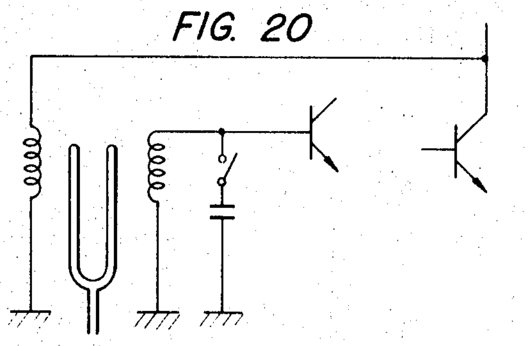
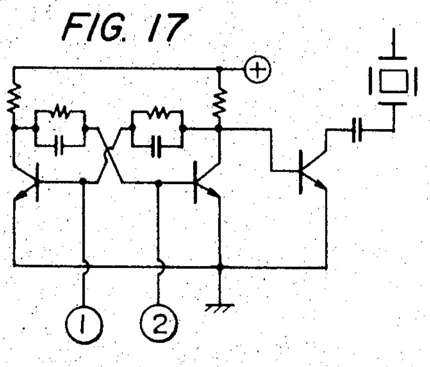
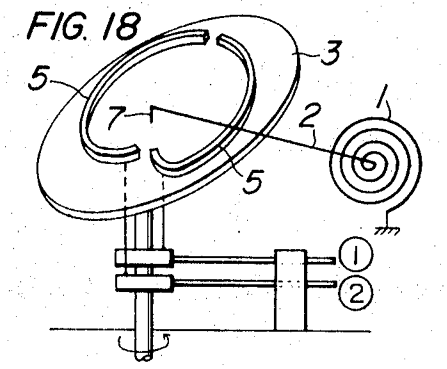
FIG. 19a
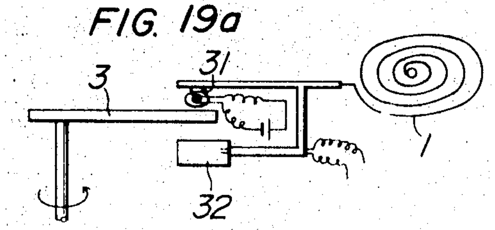
FIG. 19b
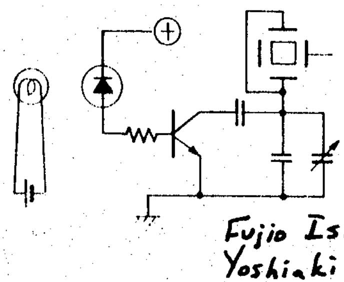
Fujio Ishida
Yoshiaki Kato
INVENTOR
BY Hall, Pollock & Vande Sande
ATTORNEY

TEMPERATURE COMPENSATED OSCILLATOR USING TEMPERATURE CONTROLLED CONTINUAL SWITCHING OF FREQUENCY DETERMINING IMPEDANCE

The present invention relates to temperature compensation for an oscillation circuit, and more particularly to temperature compensation for oscillation frequencies of an oscillator in a timepiece.

As oscillator for time standard, crystal oscillators, tuning forks, or the like have conventionally been employed. However, the oscillation frequencies of these oscillators vary with temperature. For example, frequency versus temperature characteristics of crystal oscillators are approximated by cubic or quadratic formulas, among which AT plates and GT plates are approximated by the cubic formulas while DT plates, CT plates, BT plates, NT plates, +5°X plates, and the like are approximated by quadratic formulas.

While the following description will be made with reference to crystal oscillators by way of example, it is to be noted that other oscillators such as tuning forks, reed vibrators, nonmechanical oscillators, etc. can also be employed.

A crystal oscillator is usually operated coupled with an impedance element, for example, a capacitor. The oscillation frequency of the crystal oscillator varies also with the capacitance of the capacitor in addition to variation with temperature. Consequently, the variation in the oscillation frequency of the oscillator resulted from the variation in temperature has usually been compensated for by varying the capacitance of the associated capacitor. In a prior art device a variable capacitor coupled to a bimetallic strip for controlling the capacitor is employed as the compensating capacitor. The compensation by this prior art device is a continuous one. However, this prior art device is practically complicated in structure and expensive.

Therefore, an object of the present invention is to provide a novel method of temperature compensating the oscillation frequency of an oscillator in a timepiece.

Another object of the present invention is to provide a simple and inexpensive device for temperature compensating the frequency of an oscillator in a timepiece.

In the present invention the frequency of an oscillator is compensated for by intermittently coupling a fixed capacitance to the oscillator or switching the capacitance coupled to the oscillator between two levels.

According to the present invention there is provided a method of temperature compensating an oscillation circuit including an oscillator for a timepiece comprising switching an impedance coupled to said oscillator between two levels, the ratio of the dwelling times at said levels being a function of ambient temperature, whereby the variation in the oscillation frequency of said oscillation circuit with said temperature is compensated for on an average.

According to the present invention there is also provided an oscillation circuit for a timepiece which is temperature compensated on an average, comprising an oscillator, at least one impedance element coupled to said oscillator, and switching means including a temperature sensitive element for connecting and disconnecting one of said at least one impedance element to and from said oscillator, the time ratio between connecting and disconnecting said switch being varied as a function of temperature corresponding to the temperature characteristic of said oscillator.

The present invention will become more apparent from the following detailed description of the invention made with reference to the accompanying drawings, in which:

FIGS. 1*a* and 1*b* are graphs of oscillation frequency versus temperature characteristics of time standard oscillators;

Figure 5A:
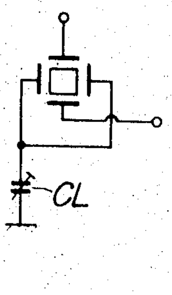
Figure 5B:
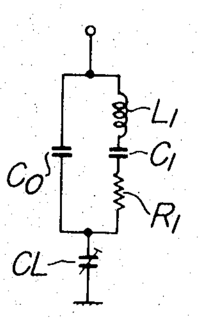
Figure 7A:
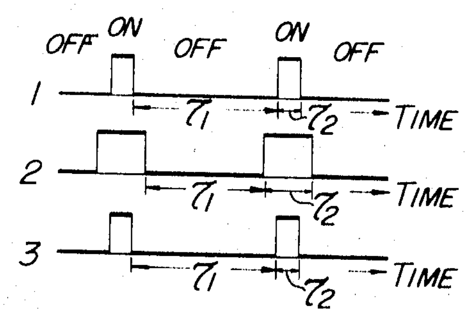
Figure 7B:
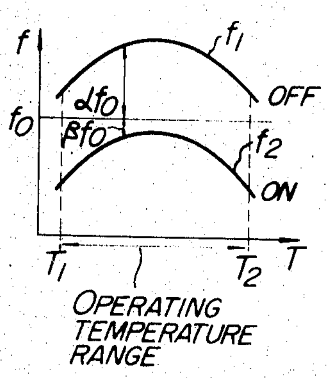
Figure 7C:
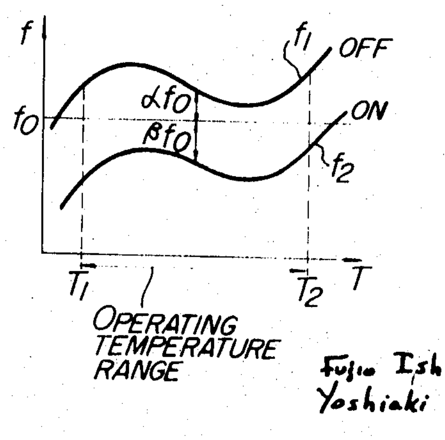
Figures 8A, 8B, 8C, 8D:
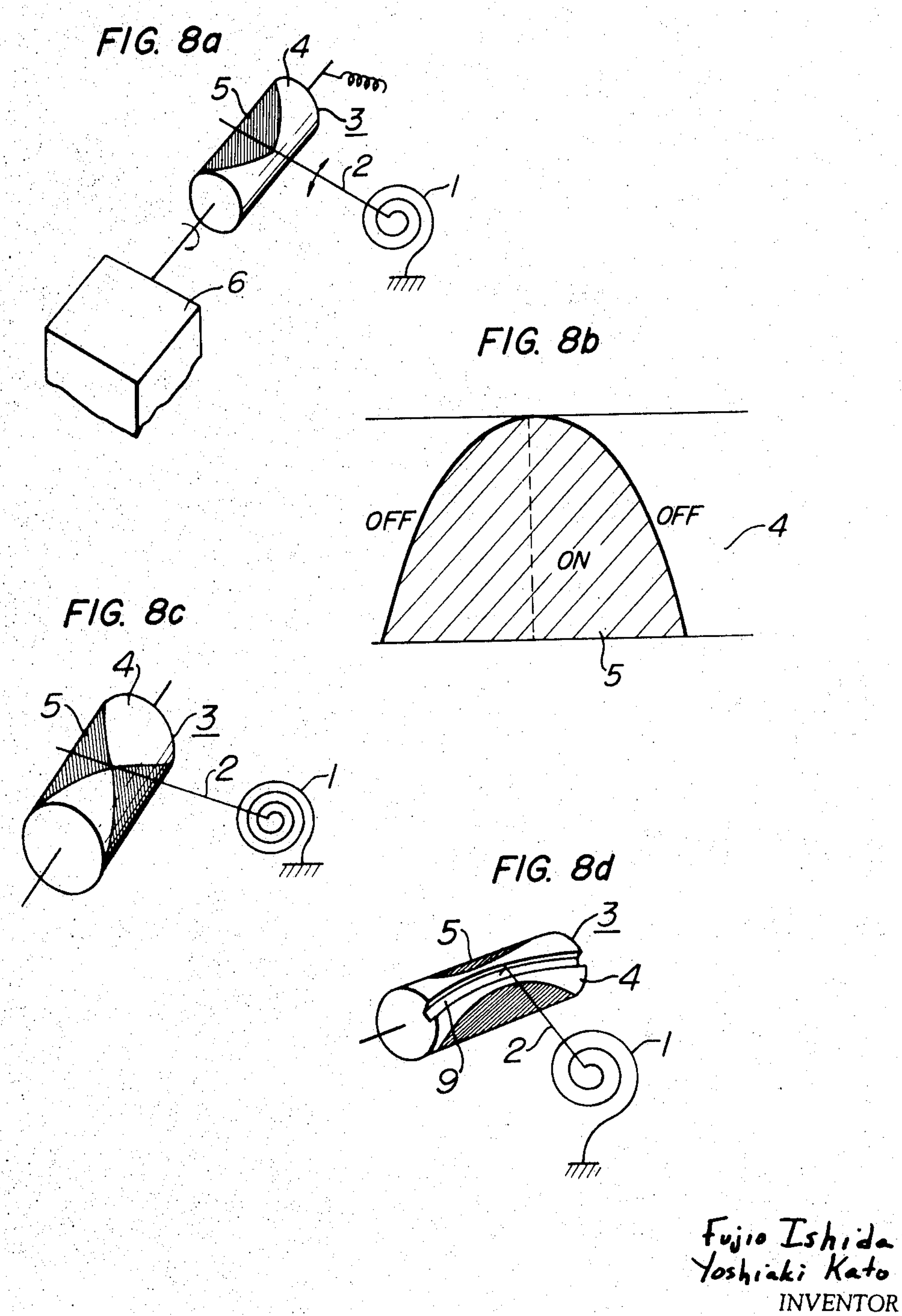

FIGS. 5*a* and 5*b* are diagrams of a conventional crystal oscillator circuit and an equivalent circuit, respectively;

FIGS. 6*a* to 6*d* are diagrams of fixed capacitance switching circuits according to the invention;

FIG. 7*a* is a diagram showing on and off states of switching;

FIGS. 7*b* and 7*c* are diagrams each showing temperature variation in oscillation frequency at two coupled capacitances;

FIG. 8*a* is a embodiment of the invention in which a contact arm slidably contacts a conductive pattern carried on a noncondutive rotary drum;

FIG. 8*b* illustrates the conductive pattern of the embodiment of FIG. 8*a;*

Figure 9A:
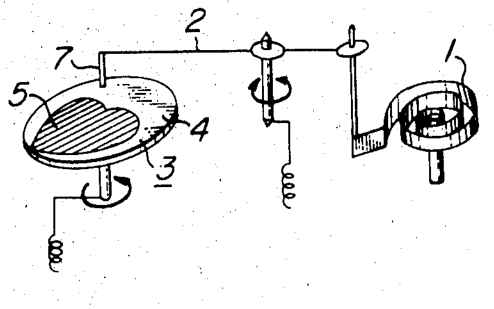
Figure 9B:
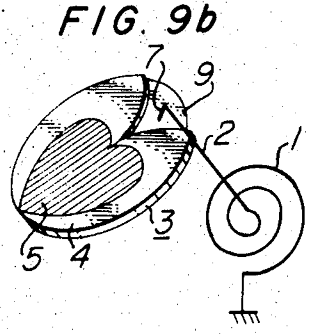
Figure 10:
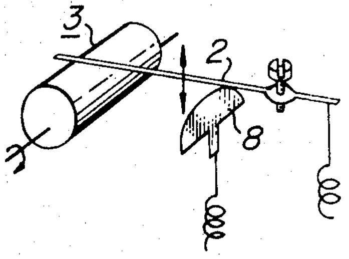
Figure 11:
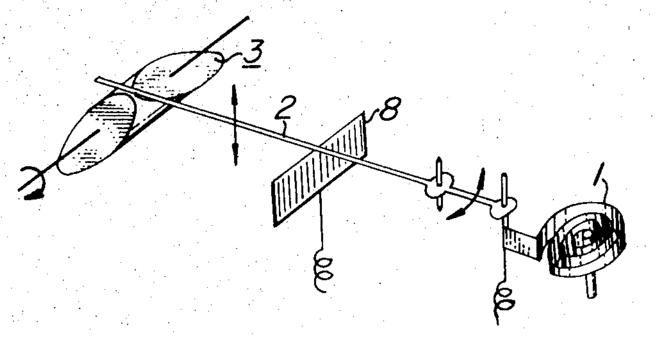
Figure 12A:
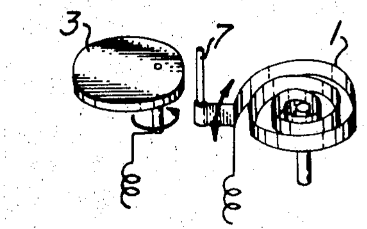
Figure 12B:
Figure 13:
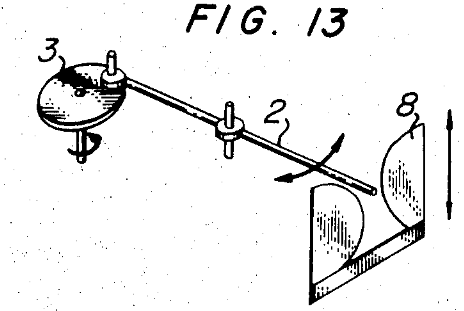
Figure 16A:
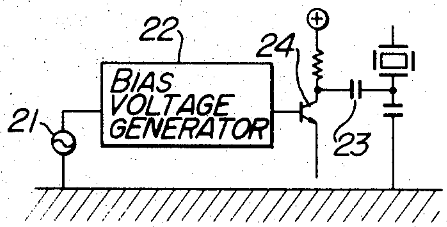
Figure 16B:
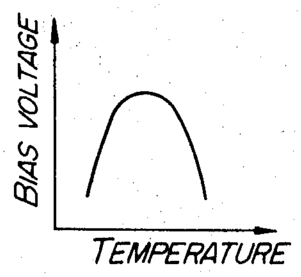
Figure 16C:
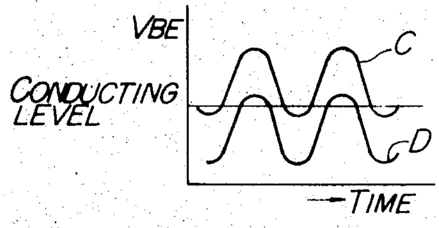
Figure 16D:
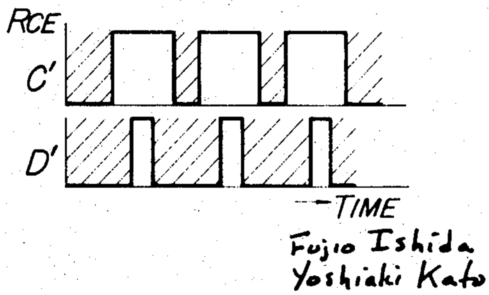

FIGS. 8*c* and 8*d* are other embodiments of the invention in which the drums carry other conductive patterns, the drum in FIG. 8*d* being provided with a recess;

FIGS. 9*a* and 9*b* are other embodiments of the invention which employ a disc, and in which the disc in FIG. 9*b* is provided with a recess;

FIG. 10 is another embodiment of the invention which employs an eccentric drum;

FIG. 11 is another embodiment of the invention which employs an obliquely truncated drum and a fixed contact;

FIGS. 12*a* and 12*b* are another embodiment of the invention employing an eccentric disc;

FIG. 13 is another embodiment of the invention employing a crank;

FIG. 14 is another embodiment of the invention which employs an eccentric disc and a reed switch;

FIG. 15 is another embodiment of the invention which employs an eccentric disc and an attitude responsive mercury switch;

FIG. 16*a* is another embodiment of the invention which employs an electronic switching circuit;

FIGS. 16*b*, 16*c* and 16*d* are graphs for explaining the operation of the embodiment of FIG. 16*a;*

FIGS. 17 and 18 are another embodiment of the invention which employs a mechanical switch and a flip-flop;

FIG. 19*a* is another embodiment of the invention which employs an optical switch;

FIG. 19*b* is a circuit diagram of the embodiment of FIG. 19*b;* and

FIG. 20 is another embodiment of the invention which employs a tuning fork as an oscillator.

Assuming that the oscillation frequency $f$ of an oscillator is a function of only temperature $T$ and the capacitance $C$ coupled to the oscillator, the variation in the frequency $$f=f(T,C)$$

is $$\Delta f=\left(\frac{\partial f}{\partial T}\right)C\cdot dT+\left(\frac{\partial f}{\partial C}\right)T\cdot dC$$

In order to maintain the frequency of the oscillator constant irrespective of temperature, i.e. $\Delta f\equiv 0$, the capacitance $C$ must satisfy a relation $$\left(\frac{\partial C}{\partial T}\right)f=-\left(\frac{\partial f}{\partial T}\right)C\bigg/\left(\frac{\partial f}{\partial C}\right)T$$

Figure 1A:
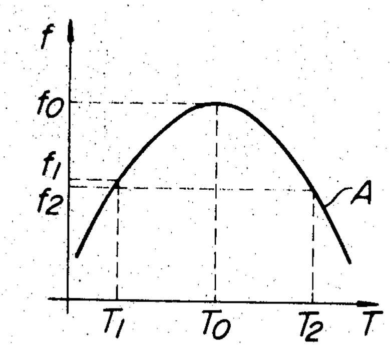
Figure 1B:
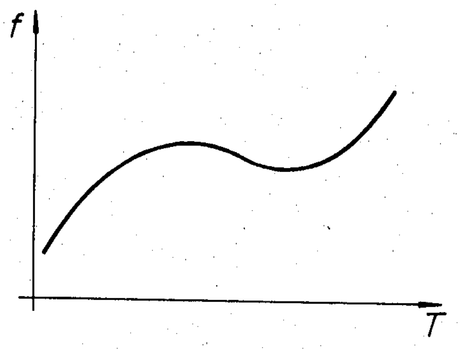
Figure 2:
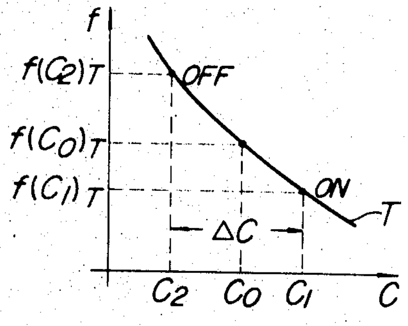
FIG. 2 is a graph showing variation in the oscillation frequency of an oscillator with a coupled capacitance.

Thus, the variation in the capacitance with temperature to be coupled to the oscillator for maintaining the frequency of the oscillator constant is known from the variations in the frequency with temperature and with the capacitance. An example of the variation in the oscillation frequency with temperature is shown in FIG. 1*a* when the frequency versus temperature characteristic is approximated by a quadratic equation an in FIG. 1*b* when it is approximated by a cubic equation. An example of the variation in the frequency with the capacitance is shown in FIG. 2. In the following description the frequency versus temperature characteristic will be assumed to be represented by a quadratic equation for the sake of simplicity only.

Figure 3:
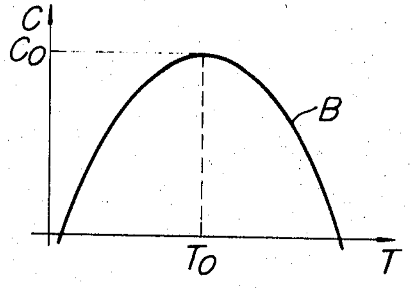
FIG. 3 is a graph showing variation in the capacitance to be coupled to an oscillator with temperature.
Figure 4:
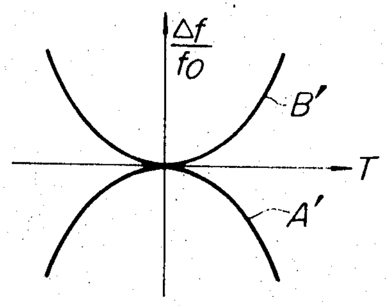
FIG. 4 is a schematic diagram showing the relation between the variation in the oscillation frequency of an oscillator with temperature to be compensated for the the variation in the compensating capacitance.

From the curves of FIGS. 1*a* and 2 the variation in the capacitance with temperature to be coupled to the oscillator to maintain the frequency of the oscillator constant is as shown in FIG. 3. If the characteristic of FIG. 2 is approximately linear within the operating temperature range, the characteristic of FIG. 3 is approximately represented by a quadratic equation B. Thus, the characteristic A of FIG. 1*a* and the characteristic B of FIG. 3 are substantially mirror images of each other as shown in FIG. 4 when plotted in terms of $\Delta f/fo$, where $f_o$ is a maximum frequency of the oscillator.

In a conventional device the variation in the capacitance to be coupled to an oscillator to compensate for the variation in the frequency of the oscillator is obtained by employing a variable capacitor CL as shown in FIG. 5*a* and by varying the capacitance by means of a bimetallic strip not shown. FIG. 5*b* is an equivalent circuit diagram to the crystal oscillator circuit of FIG. 5*a*.

Figure 6A:
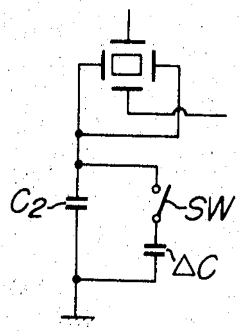
Figure 6B:
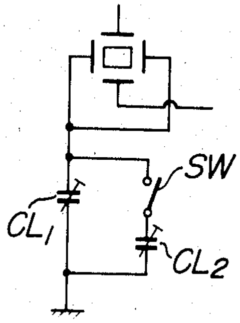
Figure 6C:
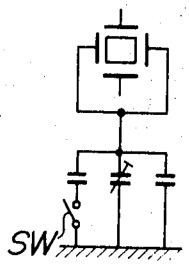
Figure 6D:
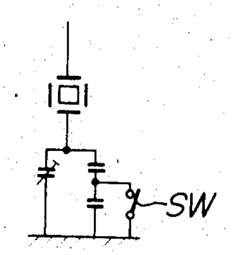

The present invention is to obtain substantially the same effect as the continuous variation in the capacitance as shown in FIG. 3 by switching the capacitance between two fixed levels such as $C_1$ and $C_2$ shown in FIG. 2. For example, by alternately making and breaking the contacts of a switch SW in a circuit as shown in FIG. 6*a* in a manner as shown in FIG. 7*a* the characteristic of FIG. 3 can be approximated on an average. Any characteristic can be approximated merely by changing the time ratio of on to off states of the switch SW as an appropriate function of temperature. In FIG. 6*a*, when the switch SW is in an off state, the coupled capacitance is $C_2$, while when the switch SW is in an on state, the coupled capacitance is $C_2+\Delta C=C_1$. FIGS. 6*b* to 6*d* show various modifications of the circuit of FIG. 6*a*. Variable capacitors in FIGS. 6*a* to 6*d* are for precise selection of capacitances.

As has just been described, two frequencies $f_1(T)$ and $f_2(T)$ varying above and below a standard frequency $f_o$, respectively, within an operating temperature range are obtained as shown in FIGS. 7*b* (quadratic function) and 7*c* (cubic function) by appropriately selecting the capacitances $C_1$ and $C_2$. $f_1(T)$ and $f_2(T)$ can be represented by $$f_1(T)=f_o+\alpha(T)f_o \qquad (\alpha>0)$$

$$f_2(T)=f_o-\beta(T)f_o \qquad (\beta>0)$$

respectively. If during time $\tau_1$ within each cycle of the repetition of the on and off states of the switches SW in FIGS. 6*a* to 6*d* the switches are in an off state and during time $\tau_2$ the switches are in an on state as shown in FIG. 7*a*, the frequency of the oscillator is $f_1$ during $\tau_1$ and is $f_2$ during $\tau_2$. Then, the average frequency $\bar{f}$ of the oscillator over one cycle $\tau_1+\tau_2$ is $$\bar{f}=\frac{f_1T_1+f_2T_2}{T_1+T_2}=\frac{(f_o+\alpha f_o)T_1+(f_o-\beta f_o)T_2}{T_1+T_2}$$

$$=f_o\frac{(T_1+T_2)+(\alpha T_1-\beta T_2)}{T_1+T_2}$$

If the ratio of $\tau_1$ to $\tau_2$ is selected to be always in inverse proportion to the ratio of $\alpha$ to $\beta$, i.e. $\tau_1/\tau_2=\beta/\alpha$, $$\frac{(T_1+T_2)+(\alpha T_1-\beta T_2)}{\eta_1+T_2}=1$$

Hence, the average frequency $\bar{f}$ is constant $$\bar{f}\equiv f_o$$

Thus, the oscillation frequency of the oscillator is temperature compensated on an average.

Various embodiments of the device of the present invention for making and breaking the contacts of the switches SW in FIGS. 6*a* to 6*d* in such a manner as satisfying the condition $\tau_1/\tau_1=\beta/\alpha$ will next be described.

In FIG. 8*a*, a drum 3 having a nonconductive area 4 and a conductive area 5 on its surface is continually rotated by means of a synchronous motor 6, for example. The nonconductive area 4 and the conductive area 5 form a pattern as shown in FIG. 8*b* on the surface of the drum 3. The drum 3 may be driven by means of the gearing of the timepiece itself instead of the motor 6. A contact arm 2 changes its position by means of a temperature sensitive device such as, for example, a bimetallic strip 1 so that the relation $\tau_1/\tau_2=\beta/\alpha$ is satisfied. The pattern of FIG. 8*b* is coordinated with the temperature response characteristic of the contact arm 2 so that the relation $\tau_1/\tau_2=\beta/\alpha$ is satisfied. FIGS. 8*c* and 8*d* show other patterns 5 on the drum 3. In FIG. 8*d* the drum 3 is provided with a recess 9 for releasing the contact of the contact arm 2 to the drum 3 in order to prevent error in the response of the arm 2 due to the friction therebetween.

In FIG. 9*a* a disc 3 having a cardioid conductive pattern 5 thereon is employed instead of the drum 3 in FIGS. 8*a*, 8*c* and 8*d*. A pivotally mounted arm 2 is moved by a bimetallic strip to vary the position of a contactor 7 in response to temperature variation. In order to avoid an error due to friction, the disc 3 may have a recess 9 as shown in FIG. 9*b*.

The embodiment of FIG. 10 employs an eccentric drum 3. A spring arm 2 is moved up and down by the rotation of the eccentric drum 3. The position of, for example, the spring arm 2 varies with temperature to change the engagement position with a fixed contact 8. The ratio of closed to open states of the switch is controlled by appropriately selecting the shape of the fixed contact 8. Instead of the spring arm 2 the contact 8 may be moved with temperature.

In the embodiment of FIG. 11 the time during which an arm 2 is contacting a fixed contact 8 is varied with the variation in engagement position of the arm 2 with a truncated drum 3 due to the movement of a bimetallic strip 1 caused by the variation in ambient temperature.

The embodiment of FIGS. 12*a* and 12*b* employs an eccentric disc (cam) 3. The position of a contactor rod 7 is varied by a bimetallic strip 1 to vary the contact time of the contactor rod 7 to the eccentric disc 3.

The embodiment of FIG. 13 employs a crank 3 to swing a spring arm 2. A contact 8 is moved up and down by means of a bimetallic strip (not shown) to change the contact time with the spring arm 2.

The above-described embodiments have the advantages that the structure and operation are simple, the gearing of the timepiece itself can be used for driving the rotating part, and the time ratio between closed and open state of the switch can be varied as an arbitrary function by changing the conductive pattern, the shape of the cam, etc. However, some of the embodiments have also the disadvantage that the contact pressure cannot be made sufficiently high because of the hysteresis of temperature compensation characteristic due to the friction.

In order to obviate the above-mentioned disadvantage the embodiment of FIG. 14 employs a reed switch 18. A cam 10 controlled by a bimetallic strip 1 determines the position of a lever 2 on which the reed switch 18 is mounted. The making and breaking operation of the reed switch 18 is effected by a constantly rotating magnetic cam 3. Since the contacts of the reed switch 18 are sealed, the reliability of this embodiment is improved.

The embodiment of FIG. 15 employs an attitude responsive mercury switch 18. The part of a lever 2 contacting a constantly rotating cam 3 is varied by means of a bimetallic strip 1 to vary the dwelling time of a drop of mercury.

In place of the above-described mechanical switching, electronic switching can be effected. In FIG. 16*a*, a bias voltage which is a function of temperature is generated by a bias voltage generating circuit 22 following an oscillator 21 and applied to the base of a transistor 24 to control the conducting state of the transistor 24. FIG. 16*b* shows the variation in bias voltage with temperature. FIG. 16*c* shows the time variation in bias voltage in bias voltage together with the conducting level of the switching element 24 in which a curve C is at a high bias voltage and a curve D is at a low bias voltage. FIG. 16*d* shows the variation in the collector-emitter resistance with time in which curves C′ and D′ correspond to the curves C and D, respectively, in FIG. 16*c*. Hatched portions in FIG. 16*d* indicate grounded times.

The embodiment of FIG. 17 employs a flip-flop circuit to perform the switching operation. Input terminals ① and ② of the flip-flop of FIG. 17 are connected to terminals ① and ② of the device of FIG. 18 to effect switching by a short time contact of a contactor 7 to a conductor 5. In this embodiment a very small contact pressure is sufficient and the hysteresis due to friction is very small.

In the embodiment of FIG. 19*a* the switching operation is performed by utilizing an electric lamp 31 and a phototransistor or photodiode 32. Light emitted from the electric lamp 31 is interrupted by a rotating light shielding plate 3. An electric circuit for the embodiment of FIG. 19*a* is shown in FIG. 19*b*.

FIG. 20 shows an application of the method of the present invention to an oscillator consisting of a tuning fork.

In the above description, although a capacitor has been employed as an impedance element, it is to be noted that a resistor or an inductor can also be employed.

As has been described, according to the present invention the temperature variation in the oscillation frequency of an oscillator can effectively be compensated for with a simple construction.

We claim:

1. A method of temperature compensating an oscillation circuit including an oscillator for a timepiece comprising continually switching impedance coupled to said oscillator between two levels, a frequency determining the ratio of the dwelling times at said levels being a function of ambient temperature, whereby the variation in the oscillation frequency of said oscillation circuit with said temperature is compensated for on an average.

2. A method according to claim 1, wherein said oscillator is a crystal oscillator and said impedance is capacitance.

3. A method according to claim 1, wherein said oscillator is a tuning fork oscillator.

4. An oscillation circuit for a timepiece which is temperature compensated on an average, comprising an oscillator, frequency at least one determining impedance element coupled to said oscillator, and switching means including a temperature sensitive element for continually connecting and disconnecting oscillator, the time ratio between connecting and disconnecting said impedance element being varied as a function of temperature corresponding to the temperature characteristic of said oscillator.

5. An oscillation circuit according to claim 4 wherein said oscillator is a crystal oscillator and said impedance element is a capacitor.

6. An oscillation circuit according to claim 4, wherein said oscillator is a tuning fork oscillator and said impedance element is a capacitor.